(12) United States Patent
McClure et al.

(10) Patent No.: US 6,207,003 B1
(45) Date of Patent: Mar. 27, 2001

(54) FABRICATION OF STRUCTURE HAVING STRUCTURAL LAYERS AND LAYERS OF CONTROLLABLE ELECTRICAL OR MAGNETIC PROPERTIES

(75) Inventors: Vance E. McClure, Encinitas; Lawrence A. Lang, Mojave, both of CA (US)

(73) Assignee: Scaled Composites, Inc., Mojave, CA (US)

(*) Notice: Subject to any disclaimer, the term of this patent is extended or adjusted under 35 U.S.C. 154(b) by 0 days.

(21) Appl. No.: 09/017,900

(22) Filed: Feb. 3, 1998

(51) Int. Cl.[7] .................................................. B32B 31/00
(52) U.S. Cl. ..................... 156/291; 156/297; 156/209; 427/131; 427/197; 427/200; 427/202; 427/206; 427/271; 427/274; 427/275; 427/302; 427/372.2; 427/375
(58) Field of Search .................................. 156/297, 290, 156/291, 209; 118/44, 72; 427/58, 127, 128, 129, 130, 131, 197, 198, 200, 202, 206, 256, 271, 274, 275, 301, 302, 372.2, 375

(56) References Cited

U.S. PATENT DOCUMENTS

| | | | |
|---|---|---|---|
| 2,838,416 | * | 6/1958 | Babiarz et al. ..................... 264/257 |
| 5,522,962 | * | 6/1996 | Koskenmaki et al. ............ 156/272.4 |

* cited by examiner

*Primary Examiner*—Francis J. Lorin

(57) ABSTRACT

A structure having layers of controllable electrical properties is prepared by furnishing a sheet of a substrate material, patterning a pattern of recesses into a surface of the sheet of the substrate material, filling the pattern of recesses with a mixture of an active phase and a matrix, and laminating the sheet to a base structure. The filled recesses may be of any desired shape, depth, and orientation. The active phase is particles of a material such as an electrical conductor or semiconductor, or magnetic particles.

18 Claims, 4 Drawing Sheets

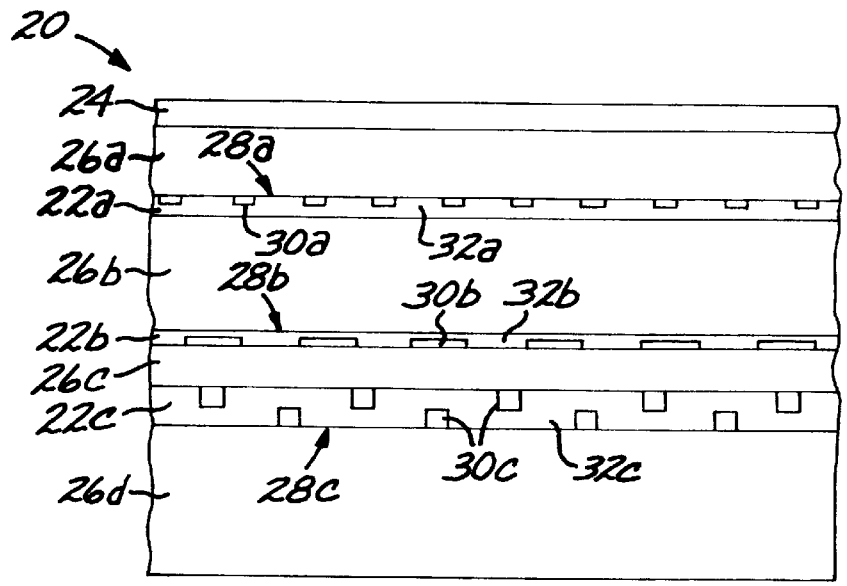
FIG. 1
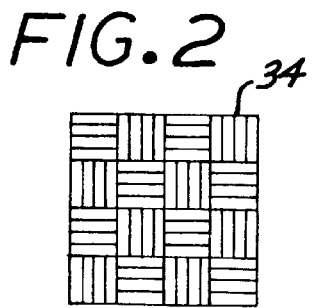  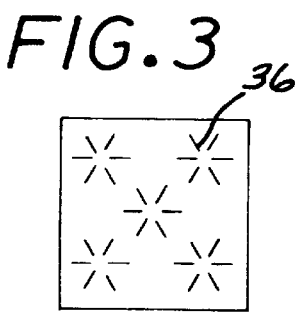  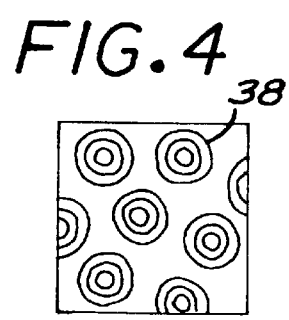
FIG. 2   FIG. 3   FIG. 4
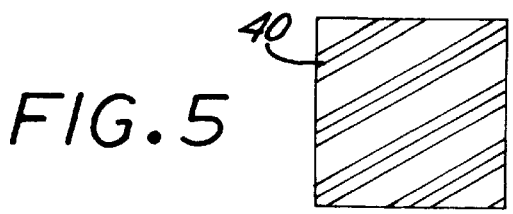
FIG. 5

FIG. 7
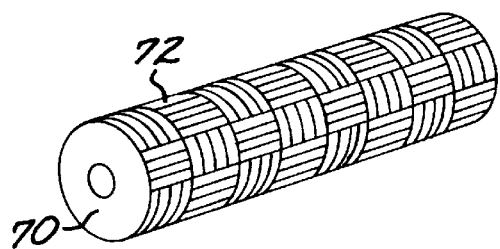
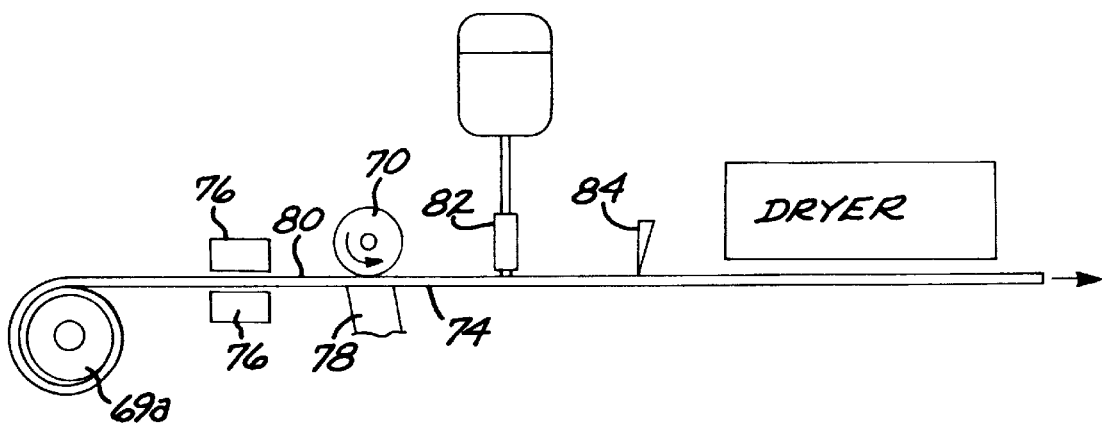
FIG. 8

FABRICATION OF STRUCTURE HAVING STRUCTURAL LAYERS AND LAYERS OF CONTROLLABLE ELECTRICAL OR MAGNETIC PROPERTIES

BACKGROUND OF THE INVENTION

This invention relates to the fabrication of a panel structure, and, more particularly, to the fabrication of a panel structure having embedded layers with selected electrical or magnetic properties.

In a number of applications, it is necessary that a panel exhibit particular electrical and/or magnetic properties, as well as being structurally strong. An example is skin panels for use in low-observables military aircraft or other vehicles having multiple, spaced-apart layers embedded within the structural skin, with each of the layers having particular electrical properties. In other applications, embedded electrically conductive or magnetic layers are useful for de-icing, lightning-protection, radome, or sensor roles. The design of the spaced-apart active layers—their specific locations, thicknesses, morphologies, and properties—depends upon the application, and such designs are known in the art. The present invention is concerned with the fabrication of such structures, not their design.

In the past, such structures have been fabricated by several techniques. In one, conductive fibers are placed into sheets of a substrate material to form an active layer, taking care to orient the individual conductive elements in desired patterns, and the sheets are laminated together with structural sheets. This approach is tedious and expensive, and it is difficult to obtain the exact patterns of fibers required for some applications. In another approach, coatings are placed onto exposed surfaces of structures. This technique is not suitable for producing embedded conductive layers with carefully controlled properties and patterns. In another approach, conductive patterns are imprinted on thin plastic sheets, such as by silk screening onto polyethylene sheets, and the imprinted sheets are laminated together with base structure. The problem with this approach is that control of the properties of the conductive pattern is difficult, and the conductive pattern is necessarily quite thin. Such materials may also be made by patterning the surface layers or sides of honeycomb materials, an expensive undertaking which is also limited as to the thickness of the conductive pattern.

There is a need for an improved approach to the fabrication of structures with embedded layers having selected electrically conductive or magnetic properties. The present invention fulfills this need, and further provides related advantages.

SUMMARY OF THE INVENTION

The present invention provides a method for preparing a structure having embedded active layers with elements having preselected electrical or magnetic properties, and preselected patterns. The method allows precise control over the electrical or magnetic properties of each active element, and also precise control over the shape, thickness, positioning, and arrangement of each active element. The method is suitable for making multilayered structures, wherein each active layer is spaced apart by a structural layer, and wherein the active layers are the same or intentionally different in properties. This approach is suitable for large-scale production of structure at relatively low cost.

In accordance with the invention, a method of preparing a structure comprises the steps of furnishing a substrate material, patterning a set of recesses into a surface of the substrate material, preferably with a patterning tool, and filling the set of recesses with a mixture of an active phase and a matrix. The matrix of the active phase is thereafter cured, if appropriate. The sheet may then be laminated to a base structure.

In a preferred approach for continuously fabricating the material, a patterning tool in the form of a patterning wheel having a set of protrusions thereon is furnished. A substrate material is contacted to the patterning wheel, thereby producing a set of recesses in a surface of the substrate material, and the set of recesses is filed with a mixture of an active phase and a matrix. The substrate material is preferably a heated sheet of an organic resin substrate material in an initially solid form or continuously cast onto the patterning wheel, as by extrusion of a flowable substrate precursor. The patterning wheel has projections thereon corresponding in location and size to the pattern of recesses to be formed, producing the pattern of recesses in the surface of the substrate material. The projections may be made in any desired pattern and may be of any desired height, so as to define a corresponding pattern and depth of recesses on the sheet. The pattern of recesses is filled with a mixture of an active phase and a matrix, which at this point is flowable so as to fill the recesses, and any excess is removed. The active phase may be any type of active material, such as an electrically conductive material, a semiconducting material, or a magnetic material. If the matrix is curable, the sheet and the mixture are cured. The sheet, with its active material and matrix, is preferably laminated to a base structure, such as a composite sheet or a foam sheet, to form a structural element. In most instances, multiple alternating active layers and structural layers are laminated together.

The use of the patterning approach to prepare the active layers offers several important advantages. A single patterning tool, such as the preferred patterning wheel, is prepared for each type of active layer. The precise pattern and depth of the active elements is defined by the projections on the patterning wheel. The arrangement of active elements is reliably repeated over large areas of the extent of the substrate material using the patterning tool. A different patterning tool is prepared for each desired arrangement of active elements, allowing different arrangements to be used for each of several active layers in the structure, if desired. This patterning approach permits the depth of each active element—its thickness in the through-thickness dimension of the panel—to be much greater than possible using conventional imprinting or screening procedures, and to be accurately controlled. The thickness of each active element, together with the lateral width of each active element and the nature of the mixture filling the recess, determines the electrical properties of that element and, ultimately, the properties of the active layer.

The present approach is therefore economical to produce large areas of active-layer material and large amounts of structure incorporating the embedded active-layer material. The properties and pattern of the active-layer material, and thence the properties of the final structure, may be controlled more accurately than with other techniques. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is an elevational view of a representative structural panel made using the approach of the invention;

FIG. 2 is a plan view of an example of a first of the active layers of the structural panel of FIG. 1;

FIG. 3 is a plan view of an example of a second of the active layers of the structural panel of FIG. 1;

FIG. 4 is a plan view of an example of a third of the active layers of the structural panel of FIG. 1;

FIG. 5 is a plan view of an example of another active layer;

FIG. 7 is a perspective view of an embossing wheel;

FIG. 8 is a schematic view of a first apparatus for preparing the active layers.

DETAILED DESCRIPTION OF THE INVENTION

Figure 6:
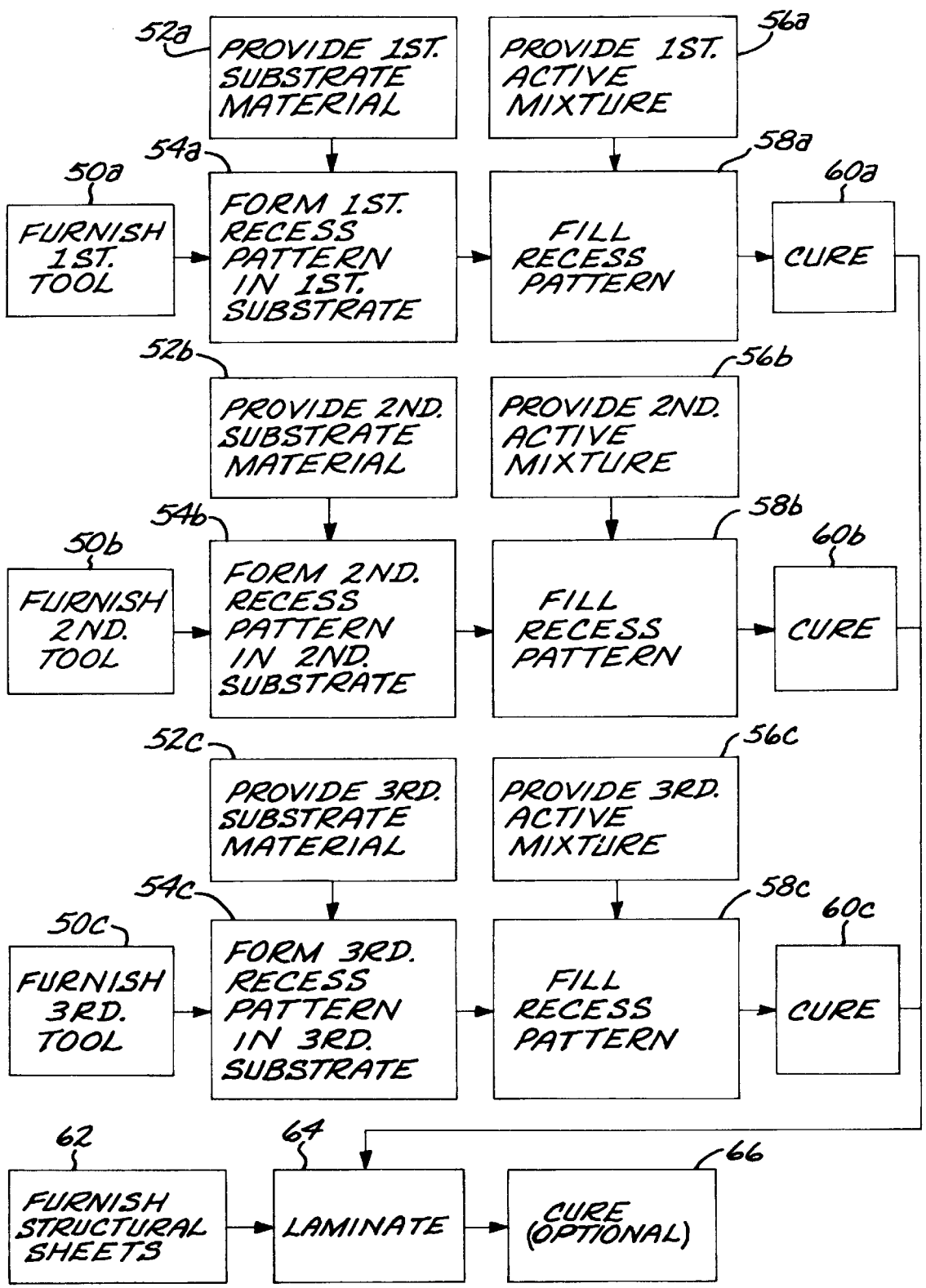
FIG. 6 is a block flow diagram of a preferred method for practicing the approach of the invention.

FIG. 1 illustrates a representative structure 20 prepared by the approach of the present invention. Many structures of interest have 1–3 active layers, and a structure with three active layers will be discussed as exemplary. However, structures in accordance with the invention may also contain 1, 2, or more than 3 active layers.

The structure 20 includes three active layers 22a, 22b, and 22c, interspersed with and supported by five structural layers: a skin layer 24 and four internal structural layers 26a, 26b, 26c, and 26d. All of the layers 22, 24, and 26 are in facing contact with and are bonded to the adjacent layers. The structure of the active layers 22 will be discussed subsequently. The structural layers which collectively form a base structure may be of any operable type. In a preferred embodiment, the skin layer 24 comprises one or more plies of a composite material of fibers such as glass fibers embedded in a cured polymeric matrix such as an epoxy matrix. In the preferred embodiment, the internal structural layers 26 are syntactic foams or resins such as epoxy reinforced with electrically non-conducting fibers such as S-glass or Kevlar™ aramid, of various types and thicknesses. The present invention permits the layers 24 and 26 to be of any operable thickness and type suitable for particular structural and electromagnetic requirements.

Each of the active layers 22a, 22b, 22c is formed of a respective pattern 28a, 28b, 28c of recesses 30a, 30b, 30c in a respective sheet 32a, 32b, 32c of substrate material, each recess 30 being filled with a respective mixture of an active phase and a matrix. Each filled recess constitutes an active element of the pattern in the respective sheet. The recesses 30 may be on the top (facing the skin layer 24) surface of the respective sheet 32, as illustrated for the active layer 22a, on the bottom surface of the respective sheet, as illustrated for the active layer 22b, or on both the top and the bottom surfaces of the respective sheet, as illustrated for the active layer 22c. The sheets 32 may be of the same or different thicknesses. The recesses 30 may be of any desired depth less than the thickness of the respective sheet 32.

The active elements (filled recesses) may be made in any operable pattern 28. FIGS. 2–5 illustrate some representative patterns that may be selected for particular applications. FIG. 2 depicts a repeating rectilinear pattern 34 of oriented active elements. FIG. 3 depicts a repeating radial pattern 36 of oriented active elements. FIG. 4 depicts a repeating circular (bulls eye) pattern 38 of oriented active elements. FIG. 5 depicts a highly anisotropic repeating pattern 40 of continuous lines, arranged in spaced-apart groups. In all of these patterns, the lengths, widths, and relative spacings of the individual elements that form the patterns may be varied as desired. The regularity of the patterns may be varied as desired, so that the patterns are regular or controllably irregular. The illustrated patterns are representative of the wide variety of patterns which may be produced by the approach of the invention, but are not limiting of the types of patterns.

The approach of the invention permits great flexibility in the selection and preparation of the physical configuration of the structure 20, as to numbers and types of layers, the patterns and sizes of active elements, and other parameters characterizing the structure, at an economical cost.

FIG. 6 illustrates a preferred method of preparing a structure according to the present approach. This method is directed toward preparing the structure of FIG. 1, but it may be modified as necessary to prepare structures with different numbers or arrangements of the layers. The procedures for preparing the active layers 22 are similar, and the same identifying numerals with suffixes will be used to describe the similar steps.

A patterning tool is provided, numeral 50, preferably in the form of a patterning wheel 70. The patterning wheel 70, illustrated in FIG. 7, is a cylinder mounted to an axle that allows it to rotate. Projections 72 extend outwardly from the cylindrical surface. The projections 72 are the inverse or negative of the recesses 30 to be formed into the surface of the substrate sheet. That is, the projections 72 have the same shape and pattern as the recesses 30, and extend upwardly by the same amount as the recesses 30 are to extend downwardly into the surface of the substrate sheet. The projections 72, and thence the recesses 30, may be made in any operable and desired pattern, and to any operable and desired height. The ability to make the recesses 30 to a desired height is an important advantage of the present invention, allowing the active elements to be made three-dimensional in nature and in a precisely oriented arrangement. The three active layers 22 may be made with the same pattern of recesses, or, more generally, three different recess patterns may be used, as indicated at numerals 50a, 50b, and 50c of FIG. 6.

Substrate material is provided, numeral 52. The substrate is preferably an organic polymeric material, most preferably a thermosetting polymer such as an epoxy. Latent curing resin systems are preferred. Such latent curing resin systems do not react at the intermediate curing temperatures required for the particle matrix. They remain flexible until they are placed in the structure, where they are co-cured with the structural layers and act as film adhesives between the structural layers. The substrate may also be an elastomer such as a silicone or a urethane that is cured before the active particle matrix. The resulting molded sheets may then be secondarily bonded to the nonconductive layers to complete the frequency-selective structure. This material and method are preferred for making flexible radar absorbers such as might be used aboard ships as hatch baffles, weather cloths, sun shades, and equipment covers, and on land as skirts for tracked vehicles.

Other operable materials may also be used for the substrate, such as ceramic precursor mixtures of ceramic particles in a fugitive binder. An example of the latter is a silicon-and/or nitrogen-containing organic material that yields a silicon carbide or silicon nitride ceramic material upon firing.

The substrate is as large laterally as required for the structural panel being fabricated, and typically is from about 0.003 inches to about 0.006 inches thick, although other thicknesses may be used as well.

The substrate material is preferably provided in one of two ways. It may be provided as a solid sheet of material that is contacted to the patterning wheel. Alternatively, the substrate sheet material may be provided by continuously casting liquid polymer material to form a sheet in contact with the patterning wheel.

Figure 9:
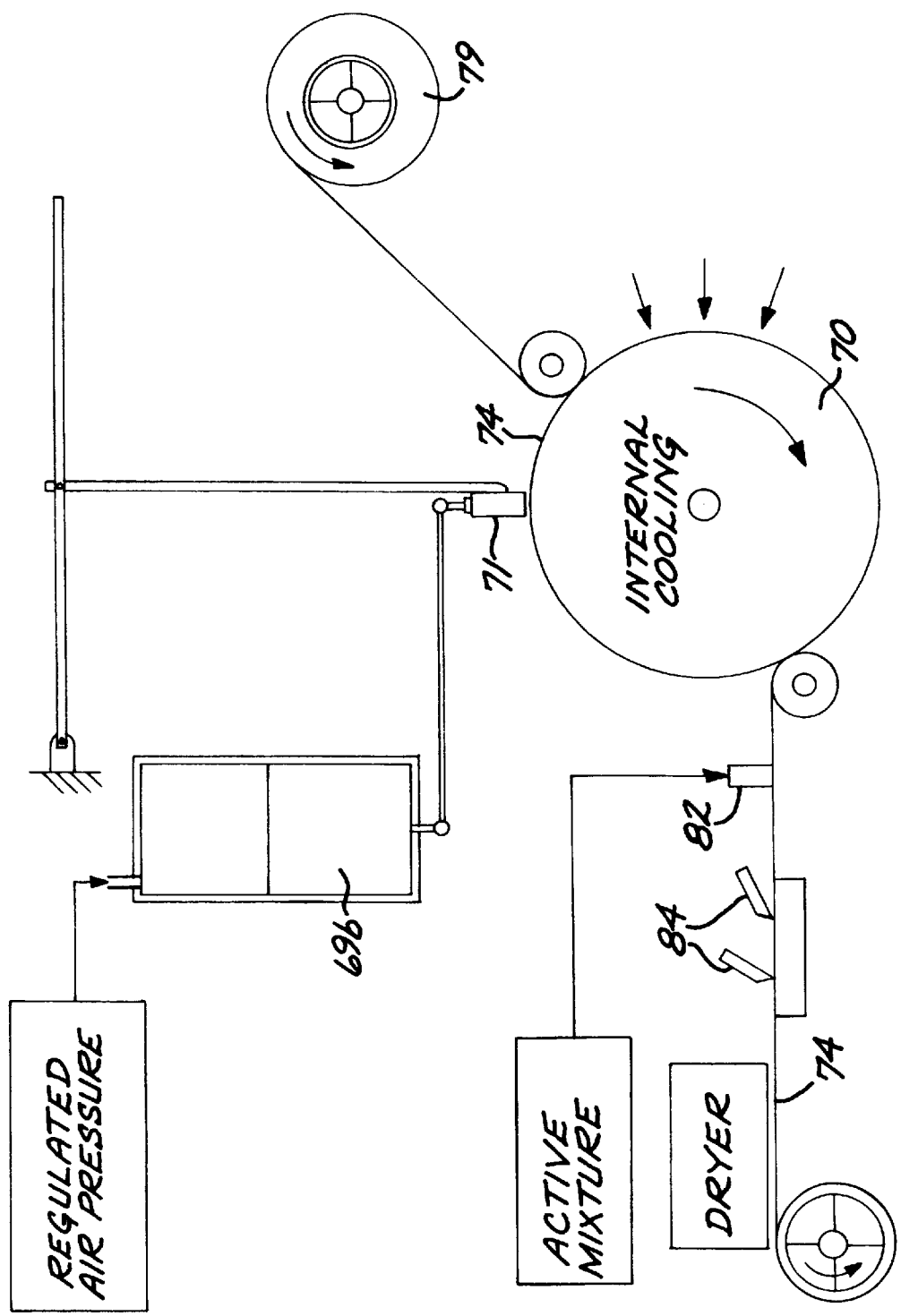
FIG. 9 is a schematic view of a second apparatus for preparing the active layers.

The pattern of projections 72 on the patterning wheel 70 is formed, numeral 54, into the surface of the substrate sheet 74. FIGS. 8 and 9 schematically illustrate two continuous approaches for manufacturing the active layer material. The process of FIG. 8 uses as a starting material a solid substrate sheet, and the process of FIG. 9 uses substrate material that is formed continuously by casting liquid polymeric resin onto the patterning wheel.

Referring to FIG. 8, a source 69*a* of solid polymeric sheet material feeds the sheet to the patterning wheel 70. To aid in accomplishing the patterning, the sheet 74 is preferably heated slightly to a temperature which slightly softens the solid polymeric material but does not cause it to cure (if it is a thermosetting plastic). Such softening temperatures are known for each such polymeric sheet material. To accomplish the heating, the sheet 74 is passed through a heater 76, such as an electrical resistance heater, before it reaches the patterning wheel 70.

The slightly heated sheet is supported on its lower side by a support 78, and the patterning wheel 70 is rolled over its upper surface 80. The pattern of projections 72 is thereby embossed into the upper surface 80 to form the pattern of recesses therein. A patterning wheel may optionally be provided to roll over the lower surface of the sheet material.

Referring to the alternative approach of FIG. 9, a source 69*b* of liquid resin material feeds the liquid resin material directly into contact with the patterning wheel 70. The liquid resin is cast onto the surface of the patterning wheel 70 through a delivery head 71 which provides a metered flow of the liquid resin. The liquid resin flows around the pattern of projections on the patterning wheel 70, reproducing the negative of those projections as recesses in the surface of the liquid polymeric material which contacts the patterning wheel 70. The patterning wheel 70 is internally cooled, as with cooling water, to remove heat from the contacting surface of the resin material and to solidify the resin material, and heat may also be removed from the non-contacting surface with a cooling gas.

The side of the sheet remote from the recesses may optionally be protected with a layer of release material, such as a release paper provided from a source 79 as shown in FIG. 9. In the approach of FIG. 8, no release paper is used. However, either process may be modified so that no release paper is used in the approach of FIG. 9, and release paper is used in the approach of FIG. 8. Where it is used, the release paper typically also acts as a support for the sheet during the subsequent manufacturing procedures.

Returning to FIG. 6, an active mixture is provided, numeral 56. The active mixture is preferably a flowable mix of particles in a flowable matrix, with a solvent present as needed to adjust its viscosity. The particles may be generally equiaxed or elongated in the form of fibers. The particles have properties selected to impart the required properties to the final active layers 22. For example, the particles may be electrically conductive metals such as aluminum or silver, electrically semi-conductive materials such as carbon, graphite, or doped silicon, or magnetic particles such as iron. The matrix is preferably a curable thermosetting polymer such as an acrylic. The solvent, where used, is preferably a nonpolar solvent such as naphtha. The selection of the specific particles, matrix, solvent, and their relative fractions in the mixture is made according to the required final properties of the active layers and will be chosen by the designers of the final articles, and does not form a part of the present invention. The present approach allows the use of different active mixtures in different layers, as indicated at numerals 56*a*, 56*b*, and 56*c*.

The recess pattern produced by the patterning wheel 70 is filled with the active mixture, numeral 58. To fill the recesses in either approach of FIG. 8 or FIG. 9, an excess of the active mixture is applied to the upper surface 80 by an applicator 82. The active mixture is forced into the recesses, and the excess is wiped away by a blade 84, termed a doctor blade in the art, which contacts the upper surface 80 as the sheet 74 passes under the blade 84.

The sheet with recesses filled with the active mixture is optionally dried and/or cured, numeral 60. Because the sheet 74 is preferably a curable polymer and the matrix of the active mixture is preferably a curable polymer, the curing 60 is preferably performed. Curing is accomplished according to time/temperature schedules provided by the manufacturers of the sheet and the matrix materials, which are known in the art for such materials. Curing need not be continued to full completion in this step 60, particularly if uncured material is desired for use in the subsequent lamination and the full curing to completion is accomplished in subsequent step 66.

The sequences 50*a*–60*a*, 50*b*–60*b*, and 50*c*–60*c* are normally not conducted simultaneously. The material of process 50*a*–60*a* is prepared, the material of process 50*b*–60*b* is prepared, and then the material of process 50*c*–60*c* is prepared. Following the three sequences 50*a*–60*a*, 50*b*–60*b*, and 50*c*–60*c*, three different active layer materials are prepared and are available for subsequent use.

The structural sheets are provided, numeral 62. These sheets include the skin layer 24 and the internal structural layers 26. These sheets are prepared elsewhere according to procedures known in the art, and provided to the present process.

The active layers 22, prepared by steps 50–60, and the structural sheets are laminated together, numeral 64. To accomplish the lamination, the sheets are first stacked together in the appropriate order and then bonded. The stacking may be accomplished in any operable manner. For example, sheets of the active layer may be cut and collated with structural sheets. In another approach, some or all of the structural sheets may be provided from the source 79 and collated continuously with the active layers. The bonding may be accomplished in any operable manner. One preferred approach is to leave the layers 22, 24 and 26 slightly undercured, and then to press the layers together at elevated temperature to interfuse and cure the layers together. Another preferred approach is to apply an adhesive to the surfaces to be bonded and to press the surfaces together, with or without heating. Equivalently for the present purposes, the lamination may be accomplished in a subassembly fashion, with subassemblies being first prepared and then laminated together to form the final assembly. The active layers 22 are typically quite thin and flexible, so that the laminates may be prepared in complex, curved shapes if necessary.

The laminated assembly is thereafter optionally cured, numeral 66. Curing is required only where some of the sheets are not fully cured previously, or if an adhesive is used and must be cured. The laminating step 64 and the curing step 66 may be combined into a single concurrent step, as by heating and pressing the layers together in a batch press or continuously between rollers. The steps 64 and 66 may also be accomplished serially as indicated in FIG. 6.

The invention has been practiced by preparing two patterning tools of different patterns. A sheet material of liquid latent-cure epoxy was cast onto the patterning tools. A paste mixture of semiconducting active particles in an acrylic matrix was prepared and applied to the recesses on the surfaces of the sheets. The excess paste mixture was removed, and the acrylic matrix material was cured at 140° F. The resulting active layers were separately bonded to foam core structures and cured at 250° F. These panels were tested for microwave performance. The performance was characterized by the center frequencies of their dielectric dispersions and by the difference between the low and high frequency asymptotes of the real permittivities, which is a measure of the polarizability per unit volume of the material. For the first pattern, the dispersion strength was 105, and the dispersion frequency was 1.9 GHz. For the second pattern, the dispersion strength was 48, and the dispersion frequency was 5.3 GHz.

The present invention provides a batch, continuous, or semi-continuous manufacturing process for preparing structures having embedded layers of selected electrical or mechanical properties. The process allows the types and spacings of the layers, the pattern of active elements, and the composition of the active elements, to be controllably varied over wide ranges as may be required for any particular application.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of preparing a structure, comprising the steps of:

furnishing a substrate material;

patterning a set of recesses into a surface of the substrate material;

filling the set of recesses with a mixture of an active phase and a matrix, wherein the active phase comprises a material selected from the group consisting of electrically conductive particles, semiconductor particles, and magnetic particles, and mixtures thereof; and thereafter laminating the sheet to a base structure comprising a material selected from the group consisting of a foamed sheet and a sheet of composite material.

2. The method of claim 1, wherein the step of furnishing includes the step of furnishing a solid sheet of an organic material.

3. The method of claim 1, wherein the step of furnishing includes the step of continuously forming a sheet of an organic material.

4. The method of claim 1, wherein the step of patterning includes the step of furnishing a patterning tool having a pattern of projections thereon corresponding to the set of recesses to be patterned into the surface of the substrate material, and contacting the surface of the substrate material to the patterning tool.

5. The method of claim 4, wherein the patterning tool is a patterning wheel.

6. The method of claim 1, wherein the step of patterning includes the step of providing a patterning tool having a pattern of projections thereon corresponding to the set of recesses to be patterned into the surface of the substrate material; and maintaining the substrate material at a temperature sufficiently high to promote the repetition of the projections on the patterning tool in the surface of the substrate material.

7. The method of claim 1, wherein the step of patterning includes the step of patterning a rectilinear pattern.

8. The method of claim 1, wherein the step of patterning includes the step of patterning a circular pattern.

9. The method of claim 1, wherein the step of filling includes the step of supplying an active phase comprising electrically conductive particles.

10. The method of claim 1, wherein the step of filling includes the step of supplying an active phase comprising semiconductor particles.

11. The method of claim 1, wherein the step of filling includes the step of supplying an active phase comprising magnetic particles.

12. The method of claim 1, wherein the step of filling includes the step of supplying a matrix comprising an acrylic.

13. The method of claim 1, wherein the matrix is curable, and including an additional step, after the step of filling, of curing the matrix.

14. The method of claim 13, wherein the step of curing includes the step of heating the sheet and the mixture to an elevated temperature.

15. The method of claim 1, wherein the substrate comprises a foamed sheet.

16. The method of claim 1, wherein the substrate comprises a sheet of composite material of fibers in a cured polymeric matrix.

17. A method of preparing a structure, comprising the steps of:

furnishing a first substrate material;

patterning a first pattern of recesses into a surface of the first substrate material;

filling the first pattern of recesses with a first mixture of a first active phase and a first curable matrix, wherein the first active phase comprises a material selected from the group consisting of electrically conductive first particles, semiconductor first particles, and magnetic first particles, and mixtures thereof;

curing the first mixture;

furnishing a second substrate material;

patterning a second pattern of recesses into a surface of the second substrate material;

filling the second pattern of recesses with a second mixture of a second active phase and a second curable matrix, wherein the second active phase comprises a material selected from the group consisting of electrically conductive second particles, semiconductor second particles, and magnetic second particles, and mixtures thereof;

curing the second mixture; and thereafter laminating the first substrate material and the second substrate material to a base structure.

18. A method of preparing a structure, comprising the steps of:

furnishing a patterning wheel having a set of protrusions thereon;

contacting a substrate material to the patterning wheel, thereby producing a set of recesses in a surface of the substrate material; and filling the set of recesses with a mixture of an active phase and a matrix, wherein the active phase comprises a material selected from the group consisting of electrically conductive particles, semiconductor particles, and magnetic particles, and mixtures thereof.

* * * * *